United States Patent
You

(10) Patent No.: US 10,108,092 B2
(45) Date of Patent: Oct. 23, 2018

(54) PHOTOLITHOGRAPHY METHOD

(71) Applicant: KOREA RESEARCH INSTITUTE OF STANDARDS AND SCIENCE, Daejeon (KR)

(72) Inventor: Eun-Ah You, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 14/895,180

(22) PCT Filed: Jun. 9, 2015

(86) PCT No.: PCT/KR2015/005768
§ 371 (c)(1),
(2) Date: Dec. 1, 2015

(87) PCT Pub. No.: WO2016/114455
PCT Pub. Date: Jul. 21, 2016

(65) Prior Publication Data
US 2017/0307980 A1    Oct. 26, 2017

(30) Foreign Application Priority Data

Jan. 15, 2015  (KR) ........................ 10-2015-0007101

(51) Int. Cl.
| | |
|---|---|
| *G03F 7/20* | (2006.01) |
| *G03F 7/00* | (2006.01) |
| *G03F 7/038* | (2006.01) |
| *G03F 7/039* | (2006.01) |
| *G03F 7/16* | (2006.01) |
| *G03F 7/32* | (2006.01) |
| *G03F 1/00* | (2012.01) |
| *G03F 1/50* | (2012.01) |

(52) U.S. Cl.
CPC .............. *G03F 7/2004* (2013.01); *G03F 1/00* (2013.01); *G03F 1/50* (2013.01); *G03F 7/00* (2013.01); *G03F 7/038* (2013.01); *G03F 7/039* (2013.01); *G03F 7/162* (2013.01); *G03F 7/32* (2013.01)

(58) Field of Classification Search
CPC ........... G03F 7/2002; G03F 1/54; G03F 7/703
USPC ......................................... 430/396
See application file for complete search history.

(56) References Cited

U.S. PATENT DOCUMENTS

| | | | | |
|---|---|---|---|---|
| 5,209,813 | A * | 5/1993 | Oshida | B82Y 10/00 216/41 |
| 6,340,635 | B1 * | 1/2002 | Toyota | H01L 21/0272 257/E21.025 |
| 2009/0207398 | A1 * | 8/2009 | Kuroda | B82Y 10/00 355/71 |
| 2013/0017499 | A1 * | 1/2013 | Ueno | H01L 21/0274 430/322 |

FOREIGN PATENT DOCUMENTS

| | | |
|---|---|---|
| JP | H08055790 A | 2/1996 |
| JP | 2002329660 A | 11/2002 |
| JP | 2007171790 A | 7/2007 |
| JP | 2010050431 A | 3/2010 |
| JP | 5652887 B2 | 1/2015 |
| KR | 1020100076680 A | 7/2010 |
| KR | 1020130137787 A | 12/2013 |
| KR | 1020150005156 A | 1/2015 |

\* cited by examiner

*Primary Examiner* — Daborah Chacko-Davis
(74) *Attorney, Agent, or Firm* — McCoy Russell LLP

(57) ABSTRACT

Provided is a photolithography method, including: a) forming a photoresist layer satisfying $D=m*(\lambda/2n)$ (D is a thickness of the photoresist layer, n is a refractive index of the photoresist, $\lambda$ is a wavelength of irradiated light at the time of exposure, and m is a natural number of 1 or more) on a substrate; and b) manufacturing a photoresist pattern having a ring shape by exposing the photoresist layer and developing the exposed photoresist layer using a photo mask including a transparent substrate and a plate-type metal dot contacting a light emitting surface of the transparent substrate.

7 Claims, 4 Drawing Sheets

FIG. 1A
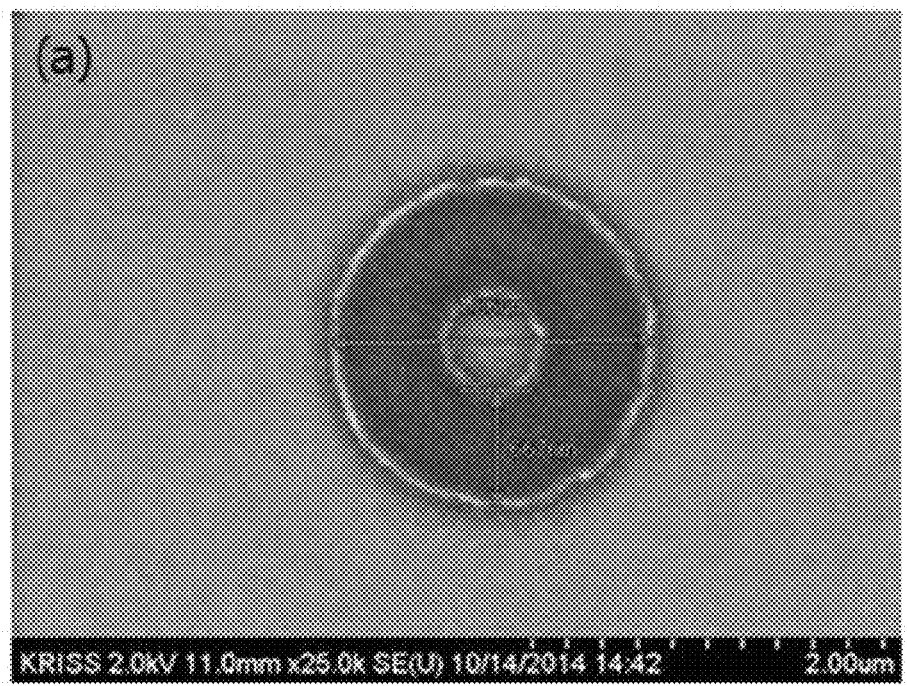
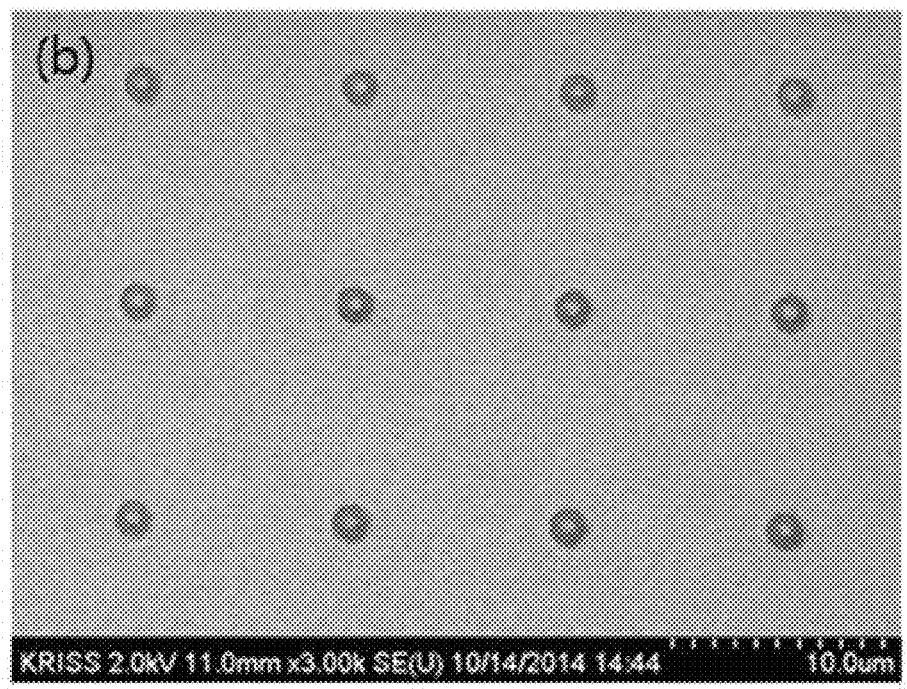
FIG. 1B

PHOTOLITHOGRAPHY METHOD

CROSS REFERENCE TO RELATED APPLICATIONS

The present application is a U.S. National Phase of International Patent Application Serial No. PCT/KR2015/005768, entitled "PHOTOLITHOGRAPHY METHOD," filed on Jun. 9, 2015, which claims priority to Korean Patent Application No. 10-2015-0007101, entitled "PHOTOLITHOGRAPHY METHOD," filed on Jan. 15, 2015, the entire contents of each of which are hereby incorporated by reference for all purposes.

TECHNICAL FIELD

The present invention relates to a photolithography method, and more particularly, to a photolithography method capable of manufacturing a ring pattern.

BACKGROUND ART

A lithography technology is a method for forming a micro pattern on a targeted substrate. A nano/micro-scale lithography technology is a core technology which dominates the development and the success or failure of semiconductor and display industries.

Limiting factor which is radically encountered upon micro patterning is a wavelength of light used in the lithography. A mercury UV lamp has been used in the case of a circuit having a line width of 0.8 μm or more but a new light source is required to pattern a line width lower than that, and a 0.13 μm process may be implemented by a kripton fluoride (KrF) excimer laser (wavelength=248 nm), and as a sub 90 nm process is required, an argon fluoride (ArF) excimer laser (wavelength=193 nm) has been used.

To use a shorter wavelength than the ArF excimer laser, a fluorine excimer laser (wavelength=157 nm) needs to be used. However, the fluorine excimer laser may cause several problems such as a reduction in numerical aperture of a lens system, and in the case of using extreme ultraviolet rays, a very expensive photo mask is required and therefore the fluorine excimer laser is hardly commercialized and in the case of using electron beam, an operation speed is very slow and equipment is expensive, which hinders practical application of the fluorine excimer laser.

Further, as disclosed in Korean Patent Laid-Open Publication No. 2010-0076680, when the micro pattern to be manufactured is sophisticated like a ring (circular ring) form, an expensive phase shift mask (PSM) in which a complicated surface ruggedness or a micro structure is formed has been used. However, the above-mentioned method inevitably involves the design and manufacturing the expensive mask and the development of a separate optical system for lithography, and therefore huge costs and research and development have to be preceded.

As described above, a new technology capable of patterning the sophisticated shape like the micro ring pattern at low cost and by the exiting lithography process and equipment is required.

RELATED ART DOCUMENT

Patent Document (Patent Document 1) Korean Patent Laid-Open Publication No. 2010-0076680

DISCLOSURE

Technical Problem

An object of the present invention is to provide a photolithography method capable of patterning a sophisticated shaped like a micro ring pattern and easily controlling a ring shape using the existing lithography process and equipment, while having an extremely simple structure.

Technical Solution

In one general aspect, a photolithography method includes: a) forming a photoresist layer satisfying the following Relational Expression 1 on a substrate; and b) manufacturing a photoresist pattern having a ring shape by exposing the photoresist layer and developing the exposed photoresist layer using a photo mask including a transparent substrate and a plate-type metal dot contacting a light emitting surface of the transparent substrate.

$$D = m*(\lambda/2n) \quad \text{[Relational Expression 1]}$$

(D is a thickness of the photoresist layer, n is a refractive index of the photoresist, λ is a wavelength of irradiated light at the time of exposure, and m is a natural number of 1 or more).

The photo mask may satisfy the following Relational Expression 2 and an interval between the photo mask and the photoresist layer may satisfy the following Relational Expression 3

$$150 \text{ nm} \leq R \leq 1.5 \text{ μm} \quad \text{[Relational Expression 2]}$$

(In the above Relational Expression 2, R is a radius of the plate-type metal dot)

$$50 \leq \text{Gap} \leq 200 \text{ nm} \quad \text{[Relational Expression 3]}$$

(In the above Relational Expression 3, a gap is a spaced distance between the photo mask and the photoresist layer).

Metal of the plate-type metal dot may be at least one selected from transition metals including Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, and Au, post-transition metals including Al, Ga, In, Tl, Sn, Pb, and Bi, and metals including Li, Be, Na, Mg, K, Ca, Rb, Sr, Cs, and Ba.

The irradiated light at the time of the exposure may be ultraviolet (UV).

The irradiated light at the time of the exposure may be irradiated at a dose of 90 to 110 mJ/cm$^2$.

The photoresist pattern may be a single-layered ring shape or a multi-layered ring shape in which at least two rings are stacked, each ring of the multi-layered ring shape may have a concentric structure, and an upper ring may be positioned in a lower ring, based on a projection image of multi-layered ring shape in a light irradiation direction.

An outer diameter of the upper ring having the multi-layered ring shape may be smaller than a diameter of the metal dot.

The photoresist pattern having the single-layered ring shape or the multi-layered ring shape may be controlled by at least one factor selected from the dose of irradiated light at the time of the exposure and the development time.

In another general aspect, a photoresist pattern manufactured using the photolithography method is provided.

Advantageous Effects

The photolithography method according to the exemplary embodiments of the present invention may have the extremely simple structure like the plate-type transparent substrate and the plate-type metal dot while patterning the sophisticated shape like the micro ring pattern. Therefore, it is possible to pattern the ring of the photoresist using the inexpensive photo mask without using the expensive PSM mask or the expensive equipment.

Further, the photolithography method according to the exemplary embodiments of the present invention may manufacture the ring pattern having the size smaller than that of the plate-type metal dot and manufacture the ring pattern having various shapes by controlling the dose of irradiated light or the development time using the same photo mask.

In addition, the existing photolithography process may be utilized without being changed by using the exposure apparatus, the exposure method, the photoresist, the developer, and the developing method typically used, except for the mask.

DESCRIPTION OF DRAWINGS

FIGS. 1A-B are details of a scanning electron microscope photograph obtained by observing a photoresist pattern manufactured according to an exemplary embodiment of the present invention.

BEST MODE

Figure 2:
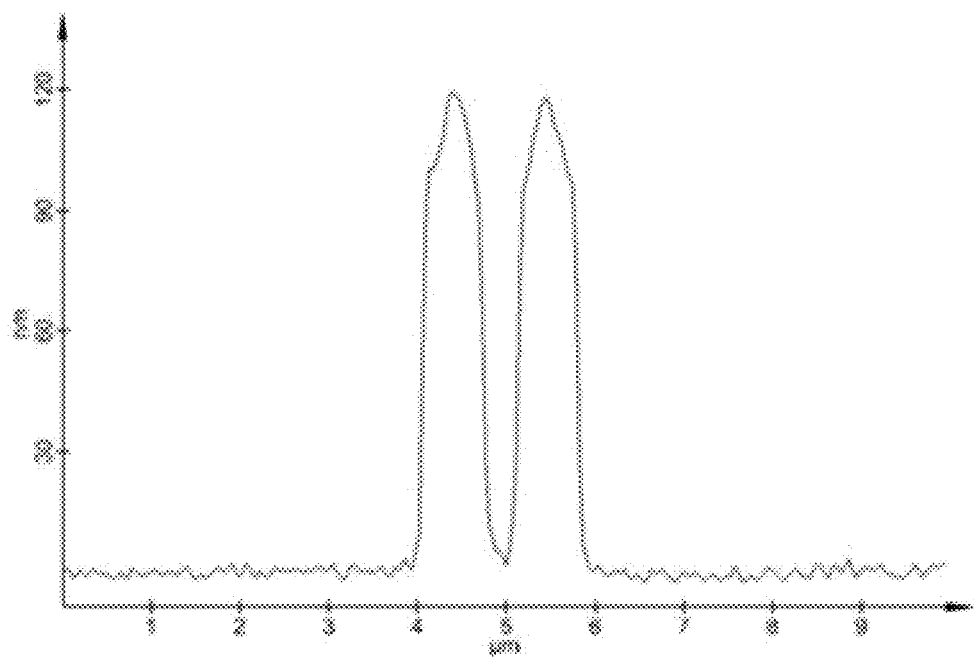
FIG. 2 is a diagram illustrating results obtained by observing the photoresist pattern manufactured according to the exemplary embodiment of the present invention with an atomic force microscope (AFM).

Hereinafter, a photolithography method according to exemplary embodiments of the present invention will be described in detail with reference to the accompanying drawings. The accompanying drawings to be provided below are provided by way of example so that the idea of the present invention can be sufficiently transferred to those skilled in the art to which the present invention pertains. Therefore, the present invention is not limited to the accompanying drawings provided below, but may be modified in many different forms. In addition, the accompanying drawings suggested below will be exaggerated in order to clear the spirit and scope of the present invention. Technical terms and scientific terms used in the present specification have the general meaning understood by those skilled in the art to which the present invention pertains unless otherwise defined, and a description for the known function and configuration unnecessarily obscuring the gist of the present invention will be omitted in the following description and the accompanying drawings.

As a performance result of a study for forming a pattern having a micro ring shape using photolithography, the present applicant surprisingly found that a single-layered or a multi-layered ring pattern may be formed by a mask having an extremely simple structure in which a plate-type metal dot is formed on a light emitting surface of a plate-type transparent substrate without artificial surface ruggedness and found that the ring pattern having an outer diameter smaller than that of a plate-type metal dot is manufactured. By deepening these discoveries, the present applicant completes the present invention.

In detail, the photoresist method according to the exemplary embodiment of the present invention includes: a) forming a photoresist layer satisfying the following Relational Expression 1 on a substrate; and b) manufacturing a photoresist pattern having a ring shape by exposing the photoresist layer and developing the exposed photoresist layer using a photo mask including a transparent substrate and a plate-type metal dot contacting a light emitting surface of the transparent substrate.

$$D=m*(\lambda/2n) \qquad \text{[Relational Expression 1]}$$

In the above Expression, D is a thickness of the photoresist layer, n is a refractive index of the photoresist, $\lambda$ is a wavelength of irradiated light at the time of exposure, and m is a natural number of 1 or more.

The thickness of the photoresist layer satisfying the conditions of the above Relational Expression 1 is set to form a standing wave in a thickness direction of the photoresist layer by resonance of the irradiated light at the time of exposure.

By satisfying the above Relational Expression 1, the photoresist pattern having the single-layered ring shape or the photoresist pattern having the multi-layered ring shape in which a plurality of rings are stacked may be manufactured and the photoresist pattern having a stacked ring shape in which a plurality of rings having a similar or equal thickness are stacked may also be manufactured.

The photoresist coated on the substrate may be a photosensitive resin. As the photosensitive resin, any polymer material may be used as long as it has resistance against chemical (solvent) changed due to light used in a typical lithography process. The photoresist may be a positive type photosensitive resin which becomes solubility against chemical (solvent) or a negative type photosensitive resin which becomes insolubility against chemical (solvent), by being exposed to light. That is, the photoresist coated on the substrate may be a positive photoresist or a negative photoresist which is commonly used in photo-lithography process in semiconductor device manufacturing field.

The thickness of the photoresist coated on the substrate needs to satisfy the above Relational Expression 1, in which the m which is a natural number may be a natural number so that a thickness D of the photoresist ranges from 50 nm to 500 nm. The reason is that if the thickness of the photoresist is too thin as less than 50 nm, the thickness of the photoresist which remains by being patterned on the substrate in the ring shape is too thin, such that the photoresist may not effectively play a mask role upon the subsequent processes such as injection of impurities into the substrate, etching the substrate, and deposition of materials on the substrate. Further, when the thickness of the photoresist coated on the substrate is too thick as exceeding 500 nm, the photoresist may effectively play the mask role upon the subsequent processes after the photolithography but a too large surface step is formed on the substrate due to the photoresist, such that the subsequent processes may not be likely to be uniformly and homogeneously performed on the desired area and the occurrence of defect may be likely to be increased upon the exposure process, thereby degrading the quality of a development cross section of the photoresist upon the development.

To effectively play the mask role without degrading the quality of the subsequent processes, prevent the yield from unwantedly reducing, and secure the quality of development cross section, the m which is a natural number of the above Relational Expression 1 is preferably a natural number so that the thickness D of the photoresist ranges from 200 to 500 nm. As described above, considering the wavelength (central wavelength) of the irradiated light and the refractive index of the photoresist, the natural number m may be appropriately set to have the desired thickness of the photoresist as described above. Considering a wavelength of ultraviolet light used in the typical photolithography process and the typical refractive index of photoresist, as a detailed and non-resistive example, m may range from 2 to 7. In this case, in the above Relational Equation 1, the thickness D of the photoresist layer means a thickness within an error range which may occur during the typical photoresist forming processes such as coating and drying a photosensitive resin solution, soft baking, and hard baking. The thickness (average thickness) within the error range may range from 0.9% to 1.1% of the D suggested in the above Relational Expression 1, in detail, 0.95% to 1.05%.

According to the photolithography method according to the exemplary embodiment of the present invention, the photo mask may satisfy the following Relational Expression 2 and an interval between the photo mask and the photoresist layer may satisfy the following Relational Expression 3.

$$150 \text{ nm} \leq R \leq 1.5 \text{ μm} \quad \text{[Relational Expression 2]}$$

In the above Relational Expression 2, R is a radius of the plate-type metal dot.

$$50 \text{ nm} \leq \text{Gap} \leq 200 \text{ nm} \quad \text{[Relational Expression 3]}$$

In the above Relational Expression 3, a gap is a spaced distance between the photo mask and the photoresist layer.

The above Relational Expressions 2 and 3 are conditions under which the photoresist pattern having a shape corresponding to the plate-type metal dot but having a hollow ring shape may be manufactured.

In detail, as suggested in the above Relational Expression 2, when a maximum radius of the plate-type metal dot exceeds 1.5 μm or a minimum radius of the plate-type metal dot is less than 150 nm, the photoresist pattern having the desired ring shape may not be likely to be manufactured by the exposure and the development.

To manufacture the pattern having the ring shape as the shape corresponding to the shape of the plate-type metal dot, the radius of the plate-type metal dot may more preferably range from 300 to 700 nm.

In this case, the thickness of the plate-type metal dot is set to be a thickness enough to prevent the irradiated light upon the exposure from being transmitted. As a detailed and non-restrictive example, the height of the plate-type metal dot may range from 50 nm to 150 nm.

As described above, it is preferable to form an extremely micro gap satisfying the above Relational Expression 3 between the photo mask and the photoresist, while satisfying the above Relational Expression 2.

The photoresist layer has a thickness satisfying the above Relations Expression 1 and is formed with an air layer (spaced distance, gap) which satisfies the above Relational Expression 3 and is equal to or less than 200 nm, along with the plate-type metal dot satisfying the above Relational Expression 2, such that a light concentration area in which light is concentrated on a center of the metal dot may be formed and a plurality of light concentration areas spaced apart from each other in the thickness direction of the photoresist may be formed.

Therefore, the photoresist layer satisfying the above Relational Expression 1 is formed with a nano air gap satisfying the above Relational Expression 3 using the photo mask formed with the plate-type metal dot satisfying the above Relational Expression 2, such that when the exposure is performed, the pattern having the single-layered ring shape and the pattern having the stacked ring shape in which the plurality of rings are stacked on each other may also be manufactured.

In detail, in the case of satisfying the above Relational Expressions 1, 2, and 3, by setting a direction from a surface to which light is irradiated in the photoresist layer to a interphase contacting the substrate in the photoresist layer as a depth direction, the first standing wave and the second standing are generated in the photoresist layer upon the exposure. The first standing wave is generated in an area corresponding to an edge of a flat plate-type metal dot in the photoresist layer. The first standing wave repeats concentration of light (constructive interference) and extinction of light (destructive interference) along the depth direction of the photoresist layer. At the same time, the second standing wave (or discrete Fresnel bright spot) in which light is repeatedly concentrated and extinct along the depth direction of the photoresist layer is generated in an area corresponding to a center of the flat plate-type metal dot in the photoresist layer. In this case, the first standing wave and the second standing wave have a phase difference of 180° from each other. That is, due to the phase difference of 180°, the concentration (constructive interference of diffracted light or Fresnel bright spot) of light of the second standing wave occurs at the thickness of the photoresist at which the extinction of light of the first standing wave occurs.

A manufacturing method according to an exemplary embodiment of the present invention may manufacture the photoresist pattern having the stacked ring shape in which the plurality of rings are stacked in the thickness direction by forming the above-mentioned first standing wave and second standing wave on the photoresist layer, based on the above Relational Expressions 1, 2, and 3.

That is, according to the manufacturing method according to the exemplary embodiment of the present invention, the photoresist pattern acquired by the exposure and the development may be the single-layered ring shape or the multi-layered ring shape in which at least two rings are stacked. In this case, in the ring shape, both of a shape of an empty space which is an inside shape of the ring and a shape of an edge which is an outside shape of the ring may have a shape corresponding to the flat plate-type metal dot.

Further, in the manufacturing method according to the exemplary embodiment of the present invention, when the exposure is performed to satisfy the above Relational Expression 3 by using the photo mask of the above Relational Expression 2, in the second standing wave, the larger the thickness direction, the narrower the width (width in a direction vertical to the depth direction) in the area in which the light is concentrated becomes. At the same time, the first standing wave has a phase difference of 180° with respect to the second standing wave and the lager the thickness direction, the wider the width of the area in which the light is extinct. The width of the area in which the light of the second standing wave is concentrated may affect an inner diameter having the ring shape and the width of the area in which the light of the first standing wave is extinct may affect an outer diameter of the ring.

Therefore, by the above-mentioned first standing wave and second standing wave, the photoresist pattern having the stacked ring shape in which the plurality of rings having a concentric structure and having the outer diameter reduced upwardly (surface side to which light is irradiated) and the inner diameter increased upwardly are stacked may be manufactured. That is, in the photoresist pattern having the multi-layered ring shape, each ring forming the multi-layered ring has the concentric structure and an upper ring may be positioned in a lower ring, based on a projection image of multi-layered ring shape in a light irradiation direction.

That is, when a difference between the outer diameter and the inner diameter of one ring is the width of the ring, the rings are stacked while forming the multi-layered ring shapes having the same concentric structure to each other, and the photoresist pattern having the multi-layered ring shape in which the rings in which the width of the ring positioned at the relatively upper portion (surface side to which light is irradiated) is narrower (smaller) than the width of the ring positioned at the relatively lower portion (substrate side) are stacked may be manufactured.

The more surprising fact is that when the exposure is performed under the condition that the nano gap satisfying the above Relational Expression 3 between the mask and the photoresist is formed by using the mask in which the extremely micro plate-type metal dot satisfying the above Relational Expression 2 is formed, the pattern having the extremely micro ring shape having the outer diameter smaller than the plate-type metal dot may be manufactured.

In detail, the outer diameter of the at least upper ring having the multi-layered ring shape may be smaller than the diameter of the metal dot. In this case, the outer diameter of the upper ring means a ring other than the bottom ring contacting the substrate, that is, a ring positioned at the upper portion of the bottom ring in the stacked ring in which at least two rings are stacked.

In more detail, the manufacturing method according to the exemplary embodiment of the present invention may manufacture the ring pattern having the outer diameter of the ring which is about 70% of the diameter of the plate-type metal dot. In detail, in the stacked ring shape, the photoresist pattern having the stacked ring shape in which the outer diameter of the upper ring including at least the top reaches 70% to 96% based on the diameter of the metal dot, in detail, 70% to 85% may be manufactured.

In the photolithography method according to the exemplary embodiment of the present invention, the photoresist pattern having the single-layered ring shape or the multi-layered ring shape may be controlled by at least one factor selected from the dose of irradiated light at the time of the exposure and the development time.

In detail, in the manufacturing method according to the exemplary embodiment of the present invention, the photoresist pattern having the single-layered ring shape or the multi-layered ring shape may be manufactured by controlling the dose of irradiated light at the time of the exposure.

When the dose of irradiated light is increased over a predetermined dose, the light concentration regions of the first standing wave may be coupled with each other. In this case, a boundary between the light concentration regions is unclear and the single-layered ring pattern may be manufactured.

That is, when light is irradiated at a dose high enough to couple between the light concentration regions of the first standing wave in the thickness direction, the single-layered ring pattern may be manufactured, while light is irradiated at a low dose so that the light concentration region and a light extinction area are alternately formed, such that the multi-layered ring pattern may be manufactured in a thickness direction of the photoresist layer.

The dose at the boundary at which the multi-layered ring pattern and the single-layered ring pattern are formed may be changed to some extent, in consideration of a kind, development conditions, etc., of the photoresist. However, to stably manufacture the multi-layered ring pattern, a dose of 110 mJ/cm$^2$ or less, in more stably, 105 mJ/cm$^2$ may preferably be irradiated.

In this case, the dose of irradiated light at the time of the exposure needs to be a dose high enough to expose the photoresist layer (that is, exposure may be performed up to the bottom surface of the photoresist which is a surface contacting a substrate). In this regard, the dose of irradiated light at the time of the exposure may be a minimum of 90 mJ/cm$^2$ or more, preferably, 95% or more.

As described above, in the case of manufacturing the photoresist pattern having the single-layered ring shape or the multi-layered ring shape, the dose of irradiated light may be 90 to 110 mJ/cm$^2$, preferably, 95 to 105 mJ/cm$^2$. When the photoresist pattern having the single-layered ring shape is manufactured substantially independent of the development time due to the dose of irradiated light, the light having the dose of irradiated light at the time of the exposure which exceeds 110 mJ/cm$^2$, more stably, 115 mJ/cm$^2$ may be irradiated.

Further, even when the exposure is performed at the dose (predetermined dose) at which the multi-layered ring may be formed, the single-layered ring pattern or the multi-layered ring pattern may be selectively manufactured by controlling the development time.

This means that even when the exposure is performed at a work dose at which the multi-layered ring is formed, the development is performed for a relatively longer period of time enough to remove the coupled portion between the photoresist region corresponding to the upper ring and the photoresist region corresponding to the lower ring by the development to manufacture the single-layered ring pattern and also means that the development is performed for a relatively shorter period of time enough not to remove the coupled portion between the photoresist region corresponding to the upper ring and the photoresist region corresponding to the lower ring by the development to manufacture the multi-layered ring pattern.

The development time may be properly changed in consideration of a kind of the photoresist, a kind of developer used for the development, etc. As a detailed example, when intending to manufacture the multi-layered ring shape, the development may be performed for 10 to 100 seconds and when intending to manufacture the single-layered ring shape, the development may be performed for 100 seconds or more, stably, 150 seconds or more.

in the manufacturing method according to the exemplary embodiment of the present invention, prior to the exposing, the forming of the photoresist layer to satisfy the above Relational Expression 1 by coating the photoresist on the substrate may be performed. In this case, the substrate may be a substrate which serves as a support and has other components formed thereon depending on the purpose of products to be manufactured, such as an electronic device, an optical device, and a sensor. A non-restrictive example of other components may include a partial impurity doping region, a recess structure, a via hole structure, etc., but the present is not limited thereto.

The substrate may be a wafer or film shape, and may be a laminate in which semiconductor, ceramic, metal, polymer or at least two materials selected therefrom are stacked while forming each layer. A non-restrictive example of the semiconductor substrate may include a laminate in which IV semiconductor including silicon (Si), germanium (Ge), or silicon germanium (SiGe), III-V semiconductor including gallium arsenic (GaAs), indium phosphorus (InP), or gallium phosphorous (GaP), II-VI semiconductor including cadmium sulfide (CdS) or zinc telluride (ZnTe), IV-VI semiconductor including lead sulfide (PbS), or at least two selected materials therefrom are stacked while forming each layer.

As described above, the photoresist (photosensitive resin) may be a positive type or a negative type and after the photosensitive resin is coated on the substrate using the typical processes including spin coating, etc., the drying (soft baking) of the coated resin layer may be performed and the hard baking may be selectively performed. In this case, a heterogeneous layer is not preferably formed on the photoresist layer so that the coated photoresist layer directly faces the photo mask through the air gap.

The exposing may be performed by positioning the photo mask between the light source and the substrate on which the photoresist layer is formed and then irradiating light so that the transparent substrate side at which the plate-type metal dot is positioned is the light emitting surface.

As described above, the photo mask may include the transparent substrate and the plate-type metal dot. By the advantages of the present invention as described above, the photo mask may be configured of the transparent substrate and the plate-type metal dot or may be configured of the transparent substrate, the plate-type metal dot, and a protrusion to be described below.

In the transparent substrate, light is incident on one surface of two opposite surfaces of the transparent substrate and is emitted from the other surface thereof. According to the exemplary embodiment of the present invention, the transparent substrate may be a plane in which at least a light emitting surface is flat and may be a transparent plate shape in which both of a light incident surface and a light emitting surface are flat.

The transparent substrate may be made of a material enough to be used as a substrate through which light is transmitted in the typical photo mask for photolithography. For example, the targeted substrate may be made of quartz, but the present invention is not limited thereto.

The transparent substrate may have a typical thickness enough to transmit light through the mask in the typical physical photo mask for photolithography. For example, the thickness of the transparent substrate may range from several μm to tens of mm, but the present invention is not limited thereto.

The plate-type metal dot may be positioned on the light emitting substrate of the transparent substrate while contacting the transparent substrate. When the exposure and the development of the photoresist are performed using the photo mask, the ring pattern having a shape corresponding to a contour (shape of an edge) of the plate-type metal dot may be manufactured.

In detail, the plate-type metal dot may have at least one shape selected from a circular shape, an oval shape, and a polygonal shape. In this case, the polygonal shape includes a triangle to an octagon, in detail, a triangle, a quadrangle (rectangle or square), a pentagon, a hexagon, a heptagon, or an octagon. Therefore, it is possible to pattern a circular ring, an oval ring, or a polygonal ring of a triangle to an octagon.

Further, the photo mask may be one in which the plate-type metal dot is arranged in one unit body and at least two unit bodies are arranged on the light emitting surface of the transparent substrate. The arrangement of the plate-type metal dot may include a regular arrange or an irregular arrangement and the arrangement of the plate-type metal dot may be properly controlled in consideration of the designed structure to be patterned.

The metal of the plate-type metal dot may be at least one selected from transition metals including Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, and Au, post-transition metals including Al, Ga, In, Tl, Sn, Pb, and Bi, and metals including Li, Be, Na, Mg, K, Ca, Rb, Sr, Cs, and Ba. In detail, the metal of the plate-type metal dot may be at least one or two selected from transition metals including Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, and Au. In more detail, the metal of the plate-type metal dot may be Cr.

In this case, the photo mask may further include a protrusion so that the nano gap (air gap) depending on the above Relational Expression 3 is formed in a region which does not affect the patterning of the photoresist layer, for example, an edge region of the transparent substrate stably and at a preset value.

As the protrusion serves to control a spaced distance between the photo mask and the photoresist layer (Gap=distance between the photo mask and the photoresist layer=distance between the plate-type metal dot and the photoresist layer), a height of the protrusion may be a value obtained by summing the height of the plate-type metal dot formed on the photo mask and the gap depending on the Relational Expression 3. Due to the protrusion described above, the size of the air gap may be controlled precisely and reproducibly by a simple method for letting the photo mask adhere to the photoresist.

To satisfy the Relational Expression 3, after the photo mask is aligned on the photoresist layer, as described above, the exposure may be performed by irradiating light at the dose of at least 90 mJ/cm$^2$.

In this case, the irradiated light may be ultraviolet (UV) and may be ultraviolet having a wavelength band of 10 nm to 500 nm. In detail, the irradiated light may be positioned at a central wavelength of 300 nm to 500 nm, in more detail, central wavelengths of 350 to 380 nm, 400 to 420 nm, and/or 420 to 450 nm. That is, the manufacturing method according to the exemplary embodiment of the present invention may perform the exposure using ultraviolet including wavelengths of I-line, H-line, and/or G-line typically used in the existing photolithography process. Further, in the exposing, light may be irradiated using the optical means typically used in the photolithography process. The reason is that the photolithography method may use the photoresist, the exposing apparatus, etc., which are typically used in the existing photolithography process other than the photo mask as they are.

The developing may be performed by the developer and the development method which are typically used in the photolithography process. As the detailed example of the positive type photoresist, the developing may be performed by removing a photosensitive resin portion of which the chemical characteristics are changed by using the developer containing a solvent which melts and removes the photosensitive resin portion of which the chemical characteristics are changed by the exposure. In this case, as described above, the photoresist pattern having the single-layered ring shape or the multi-layered ring shape may be manufactured by controlling the development time.

In the photolithography method according to the exemplary embodiment of the present invention, the foregoing exposing and developing are performed and then the subsequent processes such as the injection of impurities into the substrate, the etching of the substrate, and the deposition of materials on the substrate may be performed and after the subsequent processes are performed, physical or chemically removing the photoresist remaining (remaining by the development) on the substrate may be further performed. The removing of the remaining photoresist may be performed using a material and a method typically used to remove the photoresist developed in the photolithography process.

FIG. 1 is a photograph obtained by observing the photoresist pattern manufactured by the manufacturing method according to the exemplary embodiment of the present invention with a scanning electron microscope.

In detail, by using the plate-type quartz as the transparent substrate, the photo mask in which a Cr plate (plate-type metal dot) having a height of 100 nm and a radius of 500 nm is regularly arranged on one surface of the transparent substrate at an interval of 10 μm and the protrusion is formed to form a gap (air gap) of 100 nm was used. It is a scanning electron microscope photograph by forming the positive photoresist layer having a thickness (m=4 in the above Relational Expression 1) of 420 nm on the substrate which is a silicon wafer (S1805), adherely aligning the photo mask on the photoresist layer, performing the exposure by irradiating the ultraviolet of 365 nm at a dose of 101 mJ/cm², and then observing the photoresist pattern manufactured by developing (AZ300MIF) for 160 seconds.

FIG. 2 is a diagram illustrating results obtained by observing the ring-shaped photoresist pattern manufactured according to the exemplary embodiment of the present invention with an atomic force microscope (AFM).

As illustrated in FIGS. 1 and 2, it may be appreciated that the photoresist may be patterned in the hollow ring shape by using the mask in which the plate-type metal dot is formed only on the flat plate-like transparent substrate, not an expensive PSM and the single-layered micro ring type pattern having an outer diameter of 1.86 μm and a ring width of 667 nm may be manufactured.

Figure 3:
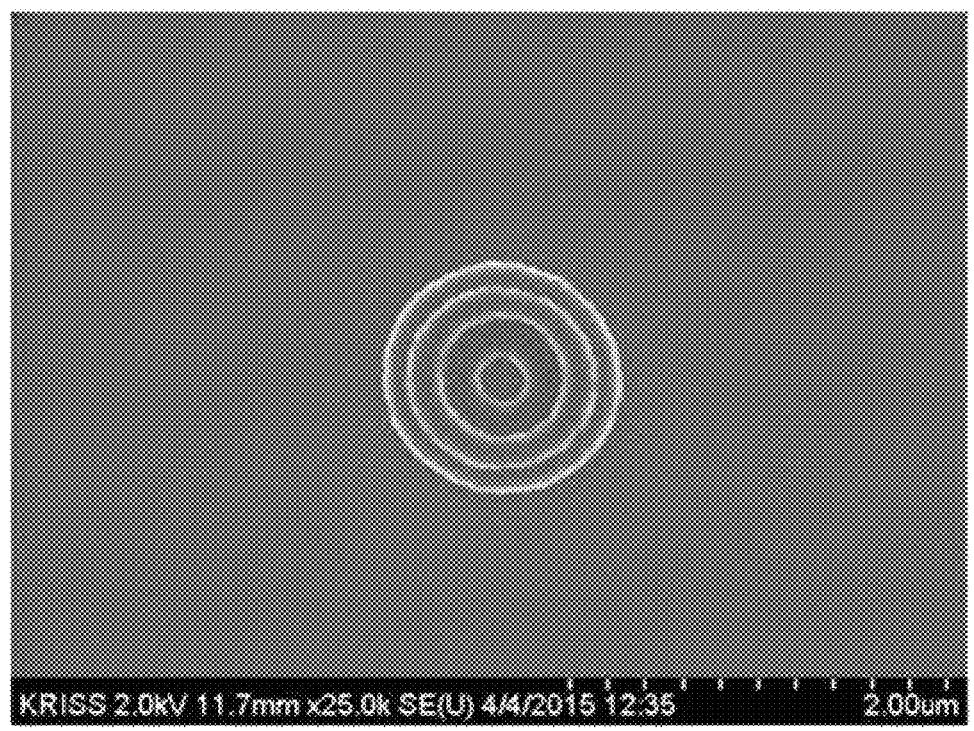
FIG. 3 is a scanning electron microscope photograph obtained by observing a photoresist pattern manufactured according to another exemplary embodiment of the present invention.
Figure 4:
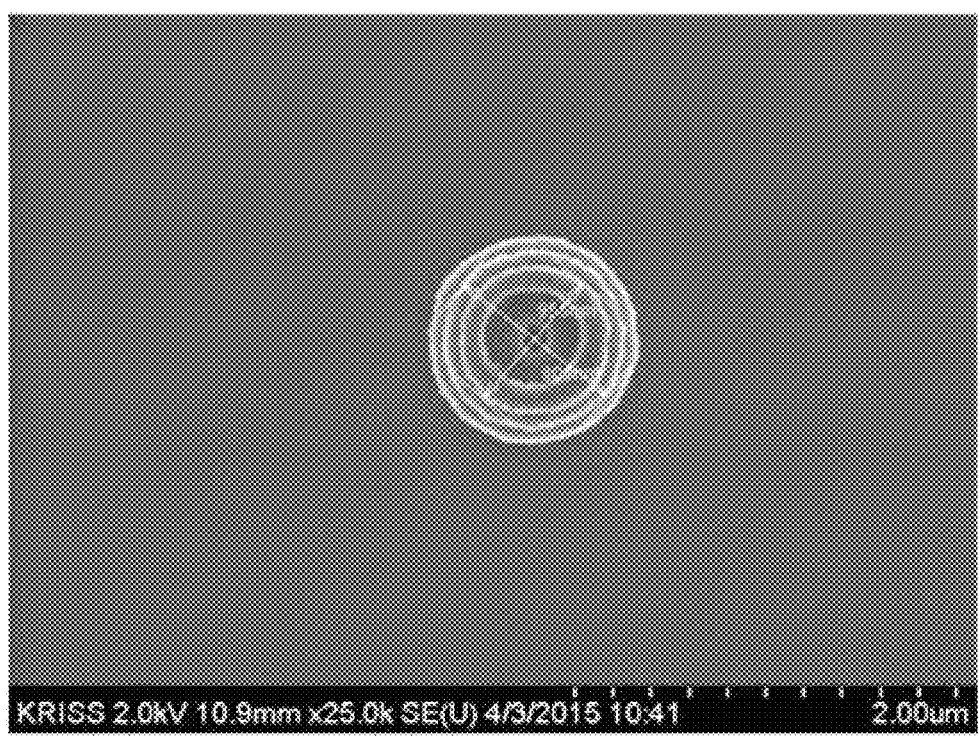
FIG. 4 is a scanning electron microscope photograph obtained by observing a photoresist pattern manufactured according to still another exemplary embodiment of the present invention.

FIG. 3 is a scanning electron microscope photograph obtained by observing the photoresist pattern manufactured by the same method as the photoresist pattern observed in FIG. 1 and by performing the development for 62 seconds and FIG. 4 is a scanning electron microscope photograph obtained by observing the photoresist pattern manufactured by the same method as the photoresist pattern observed in FIG. 1 and by performing the development for 17 seconds.

As illustrated in FIGS. 3 and 4, it may be appreciated that the multi-layered ring pattern having the concentric structure and the outer diameter of the ring reduced upwardly may be manufactured by the manufacturing method according to the present invention.

Further, as illustrated in FIGS. 1, 3, and 4, it may be appreciated that the ring type pattern having the single-layer, two-layer, or three-layer structure is manufactured by performing the exposure to form the exposed region as the multi-layered ring structure and then controlling only the development time.

Further, as can be appreciated from FIG. 4, it may be appreciated that the ring pattern having a size smaller than that of the plate-type metal dots of which the outer diameter is 955 nm and the outer diameter is 805 nm may be manufactured, by using the photo mask formed with the plate-type metal dot of which the diameter is 1000 nm.

The photoresist pattern having the single-layered ring shape was manufactured by the same method as the photoresist pattern observed in FIG. 1 but as the result of performing the exposure so that the dose of irradiated light is 111 mJ/cm², it was confirmed that the photoresist pattern having the single-layered ring shape is manufactured independent of the development time.

Further, when the thickness of the photoresist layer is controlled so that m=3.5, it was confirmed that the exposure and the development are performed by the same method as the photoresist pattern observed in FIGS. 1, 3, and 4 but the ring type pattern is not manufactured.

Hereinabove, although the present invention has been described by specific matters, exemplary embodiments, and drawings, they have been provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to these exemplary embodiments, but the claims and all of modifications equal or equivalent to the claims are intended to fall within the scope and spirit of the present invention.

The invention claimed is:

1. A photolithography method, comprising:
   a) forming a photoresist layer satisfying the following Relational Expression 1 on a substrate; and
   b) manufacturing a photoresist pattern having a ring shape by exposing the photoresist layer and developing the exposed photoresist layer using a photo mask including a transparent substrate and a metal plate in a circular shape formed on a light emitting surface of the transparent substrate to prevent transmission of light, and wherein the photo mask satisfies the following Relational Expression 2, wherein an air gap is formed between the photoresist layer and the photo mask $$D=m*(\lambda/2n)$$ [Relational Expression 1]

(D is a thickness of the photoresist layer, n is a refractive index of a photoresist, λ, is a wavelength of irradiated light at the time of exposure, and m is a natural number of 1 or more)

$$150 \text{ nm} \leq R \leq 1.5 \text{ μm}$$ [Relational Expression 2]

(In the above Relational Expression 2, R is a radius of the metal plate in a circular shape).

2. The photolithography method of claim 1, wherein a size of the air gap satisfies the following Relational Expression 3

$$50 \leq \text{Gap} \leq 200 \text{ nm}$$ [Relational Expression 3]

(In the above Relational Expression 3, the size of the air gap is a spaced distance between the photo mask and the photoresist layer).

3. The photolithography method of claim 1, wherein metal of the metal plate is at least one selected from transition metals including Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Jr, Pt, and Au, post-transition metals including Al, Ga, In, Tl, Sn, Pb, and Bi, and metals including Li, Be, Na, Mg, K, Ca, Rb, Sr, Cs, and Ba.

4. The photolithography method of claim 1, wherein the irradiated light at the time of the exposure is ultraviolet (UV) and is irradiated at a dose of 90 to 110 mJ/cm2.

5. The photolithography method of claim 1, wherein the photoresist pattern is a single-layered ring shape or a multi-layered ring shape in which at least two rings are stacked, each ring of the multi-layered ring shape has a concentric structure, and an upper ring is positioned in a lower ring, based on a projection image of multi-layered ring shape in a light irradiation direction.

6. The photolithography method of claim 5, wherein an outer diameter of the upper ring having the multi-layered ring shape is smaller than a diameter of the metal plate.

7. The photolithography method of claim 5, wherein the photoresist pattern having the single-layered ring shape or the multi-layered ring shape is controlled by at least one factor selected from the dose of irradiated light at the time of the exposure and a development time.

* * * * *